United States Patent [19]
Hanyu et al.

[11] Patent Number: 5,368,963
[45] Date of Patent: Nov. 29, 1994

[54] PHOTOMASK AND METHOD OF FABRICATING THE SAME

[75] Inventors: Isamu Hanyu; Satoru Asai, both of Kawasaki, Japan

[73] Assignee: Fujitsu Limited, Kawasaki, Japan

[21] Appl. No.: 916,262

[22] Filed: Jul. 21, 1992

[30] Foreign Application Priority Data

Jul. 30, 1991 [JP] Japan .................... 3-190091

[51] Int. Cl.$^5$ .............................. G03F 9/00
[52] U.S. Cl. ........................... 430/5; 430/269; 430/311
[58] Field of Search ............ 430/5, 22, 321, 323, 430/324, 311, 396, 945

[56] References Cited

U.S. PATENT DOCUMENTS

5,229,255  7/1993  White ............................ 430/5

FOREIGN PATENT DOCUMENTS

0395425 10/1990 European Pat. Off. .
0437376  7/1991 European Pat. Off. .
0492630  7/1992 European Pat. Off. .

OTHER PUBLICATIONS

Ohtsuka et al., "Conjugate Twin-Shifter for the New Phase Shift Method to High Resolution Lithography," Spie vol. 1463, Optical/Laser Microlithograph IV (1991), pp. 112–123.
Patent Abstracts of Japan, vol. 16, No. 605 (P-1365) Jun. 5, 1992 & JP-A-4 055854 (Matsushita Electric Ind Co) Feb. 24, 1992.

Primary Examiner—Steve Rosasco
Attorney, Agent, or Firm—Staas & Halsey

[57] ABSTRACT

A photomask comprises light shielding areas with a light shielding layer formed on a mask substrate, and a light transmitting area defined on the mask substrate by the light shielding areas, the light transmitting area being divided in a first area with a 90° phase shifter formed thereon for shifting phase of transmitted light by 90°, a second area with a 270° phase shifter formed thereon for shifting phase of transmitted light by 270°, and a third area with neither the 90° phase shifter nor the 270° phase shifter formed thereon, the first and the second areas being arranged without being overlapped on each other and with the light shielding areas or the third area located therebetween.

11 Claims, 13 Drawing Sheets

PHOTOMASK AND METHOD OF FABRICATING THE SAME

BACKGROUND OF THE INVENTION

The present invention relates to a photomask for use in optical lithography for the fabrication of semiconductor devices and so on, particularly to a photomask having phase shifters for shifting a phase of transmitted light, and to a method of fabricating the photomask.

Accompanying demands for larger-scales and higher integration of semiconductor integrated circuits in recent years, micronized patterning is required. To improve resolutions for optical lithography using photomasks there have been proposed phase shift masks using phase shifters for shifting phases of transmitted light. A phase shift mask of e.g., a line and space pattern of alternated light shielding and light transmitting areas is intended to improve resolutions of patterns by setting at. 180° a phase difference between light transmitting areas with light shielding areas therebetween.

But in the case of a phase shift mask having a part in a light transmitting area, where a phase inversion of transmitted light takes place (i.e., an area (0° area) with no phase shifter formed thereon and an area (180° area) with a 180° phase shifter formed on are adjacent to each other) a light intensity of the transmitted light is lowered at the part although the part is the light transmitting area. Consequently by using such phase shift mask, resists adversely remain at parts where patterns are not to be formed. Attention has to be paid to arrangements of phase shifters so as not to form parts in light transmitting areas, where no phase inversions take place.

To remove such limitation to the arrangement of phase shifters, a 90° shifter, for example, is arranged at a part where a phase is inverted, whereby a sharp shift of a phase in a light transmitting area has been prevented.

This type of conventional photomask is shown in FIG. 12. FIG. 12A is a plan view of the photomask, FIG. 12B is a sectional view along the line A1–A1' of FIG. 12A, and FIG. 12C is a sectional view along the line B1–B' of FIG. 12A.

Chrome layers 102 are formed in lines on a mask substrate 100. To shift phase by 180° in every two ones of light transmitting areas sandwiched by the chrome layers 102, phase shifters 104, 106 each for shifting a phase by 90° are superposed on each other, and the lower phase shifter 104 alone is formed on borders of a light transmitting areas with none of the phase shifters formed thereon. In the borders of the light transmitting areas without the phase shifters a phase is bluntly shifted by 90°, so that no sharp phase shifts take place.

Another conventional phase shift mask having phase shifters so arranged that the light transmitting area has no part where a phase is inverted in FIG. 13 (H. Ohtsuka et al., "Conjugate Twin-Shifter for the New Phase Shift Method to High Resolution Lithography", SPIE, Vol. 1463, pp. 112–123, Optical/Laser Microlithography IV (1991)). FIG. 13A is a plan view of the photomask, and FIG. 13B is a sectional view along the line A2—A2 of FIG. 13A.

In this conventional phase shifter, chrome layers 102 are formed on a mask substrate 100, and 90° phase sifters 108 for shifting a phase by 90° and 270° phase shifters 110 for shifting a phase by 270° are alternately formed on each of light transmitting areas sandwiched by the chrome layers 102.

A phase is inverted in the boundary parts between the 90° phase shifter 108 and the 270° phase shifter 110. But in FIG. 13, because of the chrome layers 102 on the boundary parts, the light transmitting area has no parts where a phase inversion takes place.

In the conventional phase shift mask shown in FIG. 12, in which a phase is shifted by 180° in the light transmitting areas, the shifters 104, 106 each for shifting a phase by 90° are superposed on each other. If a defect is found in a phase shifter of the photomask, it will be difficult to correct the shifter alone separately.

The conventional shift mask of FIG. 13 has the problem that a light intensity is so lowered in the boundary parts of the phase shifters 108, 110 that a focus margin upon an exposure is lowered.

SUMMARY OF THE INVENTION

An object of the present invention is to provide a photomask a method of fabricating the photomask and, which can shift a phase in light transmitting areas without lowering an intensity of transmitted light, can easily correct defects of its phase shifters, and can secure a sufficient focus margin upon an exposure.

The object of the present invention is achieved by a photomask comprising light shielding areas with a light shielding layer formed on a mask substrate, and a light transmitting area defined on the mask substrate by the light shielding areas, the light transmitting area being divided in a first area with a 90° phase shifter formed thereon for shifting a phase of transmitted light by 90° $+m\times 360°$ ($m=0,1,2,\ldots$), a second area with a 270° phase shifter formed thereon for shifting a phase of transmitted light by 270° $+n\times 360°$ ($n=0,1,2,\ldots$), and a third area for shifting a phase of transmitted light by 0°, the first and the second areas being arranged without being overlapped on each other and with the light shielding areas or the third area located therebetween.

The object of the present invention is achieved by a method of fabricating a photomask comprising the steps of forming an etching stopping layer on an entire area of a mask substrate, and forming a light shielding layer on parts of the surface to be light shielding areas, forming a first phase shifter on the entire surface for shifting a phase of transmitted light by a first angle, forming a first resist layer on a first area of the light transmitting area without the light shielding layer formed thereon, etching off a part of the first phase shifter with the first resist layer as a mask to leave the first phase shifter on the first area, forming a second resist layer with an opening corresponding to a second area of the light transmitting area, forming a second phase shifter on the entire surface for shifting a phase of the transmitted light by a second angle, and removing the second resist layer to lift off the second phase shifter to leave the second phase shifter in the second area.

In the present invention, the first area with a 90° shifter formed thereon, and the second area with a 270° ; shifter formed thereon are arranged with a light shielding area or the third area with no shifter formed thereon. Consequently the photomask has no parts in the light transmitting area, where a phase of the transmitted light is sharply shifted, and consequently an intensity of the light is lowered. Furthermore, the 90° shifter and the 270° shifter are not overlapped on each other. Consequently even if a defect should take place

DETAILED DESCRIPTION OF THE INVENTION

Figure 1:
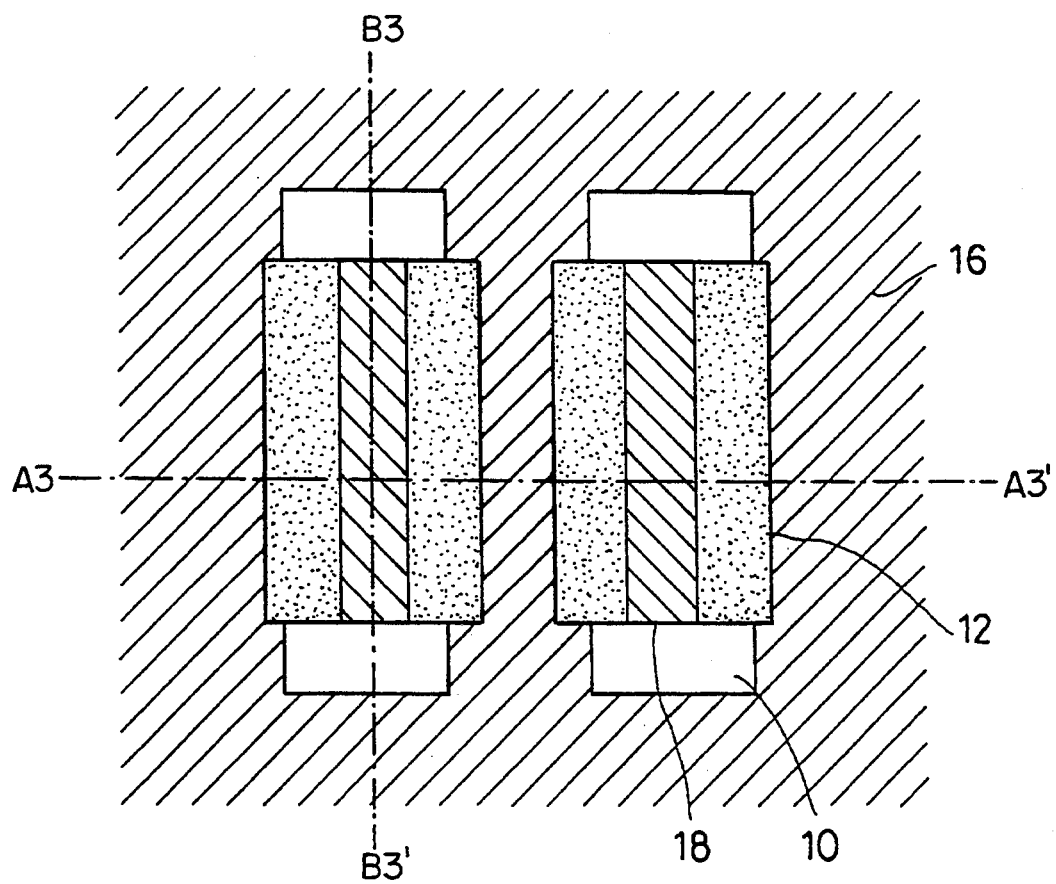
FIG. 1 is a view of the photomask according to one embodiment of the present invention.
Figure 2A:
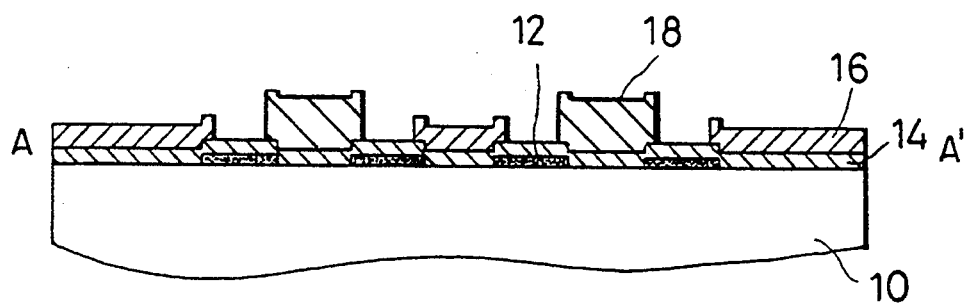
FIG. 2. (A-B) illustrates views of the photomask according to one embodiment of the present invention.
Figure 2B:
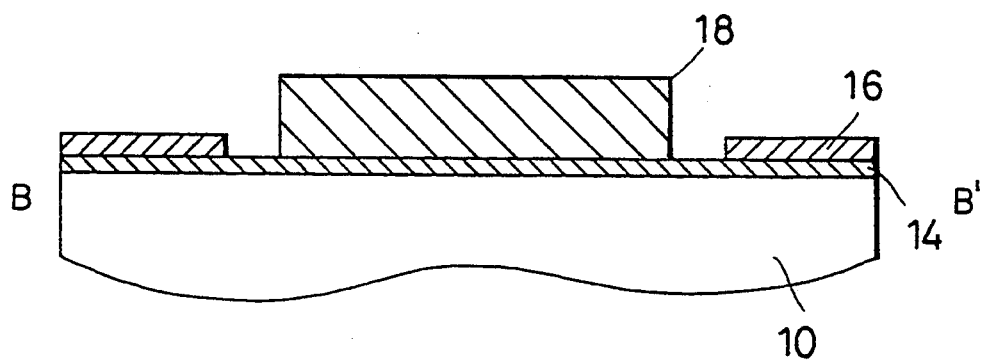

The photomask according to one embodiment of the present invention will be explained with reference to FIGS. 1 and 2 (A-B) FIG. 1 is a plan view of the photomask, FIG. 2A is a sectional view along the line A3–A3' of FIG. 1, and FIG. 2B is a sectional view along the line B3—B3 of FIG. 1.

Four chrome layers 12 of a light shielding layer are formed in lines on a mask substrate 10 of quartz. An etching stopping layer 14 for blocking etching is formed on the entire mask substrate 14 including the chrome layers 12. The etching stopping layer 14 is formed of, e.g., $Al_2O_3$.

Three light transmitting areas are defined between each of four chrome layers 12 and its adjacent one, and a 90° phase shifter 16 for shifting a phase by 90° is formed on the central transmitting area of the three transmitting areas. The 90° phase shifter 16 is, e.g., an about 190 nm-thickness $SiO_2$ layer. This 90° phase shifter 16 is formed uninterruptedly up to the peripheral areas of the chrome layers 12.

A 270° phase shifter 18 for shifting a phase by 270° is formed on each of the right and the left light transmitting areas of the three light transmitting areas sandwiched by each of the four chrome layers 12 and its adjacent one. The 270° phase shifters 18 are formed of, e.g., an about 570 nm-thickness $SiO_2$ layer. The 270° phase shifters 18 are formed only on the light transmitting areas between the chrome layers 12.

The 90° phase shifter 16 is formed on the shorter sides of each of the 270° phase shifters 18 through light transmitting areas without any phase shifter formed on. The 90° phase shifter 16 is formed also on the longer sides of each of the 270° phase shifters 18 through the light shielding areas of the chrome layers 12.

In the photomask according to this embodiment, the 90° phase shifter 16 and the 270° phase shifter 18 are adjacent to each other through the light transmitting areas without any phase shifter formed thereon or the light shielding areas of the chrome layers 12, and accordingly there is no part where a phase sharply shifts by an angle larger than 90°. Furthermore, the 90° phase shifter 16 and the 270° phase shifter 18 are not overlapped on each other, and consequently possible defects of the 90° phase shifter 16 and the 270° phase shifter can be corrected separately.

According to the photomask according to this embodiment, a light intensity is not lowered in the outer boundary part of the phase shifters, and consequently a sufficient focus margin can be secured upon an exposure.

Figure 13A:
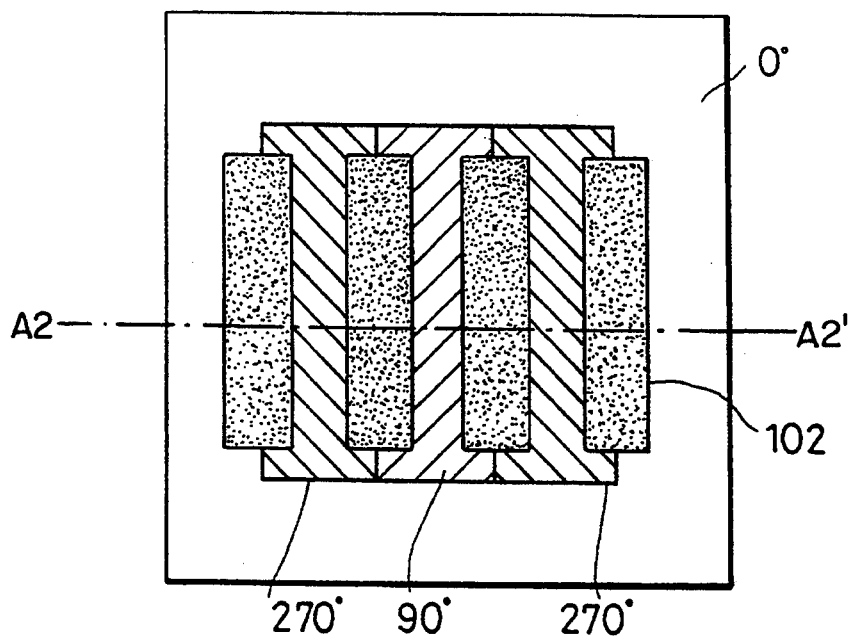
FIG. 13 (A-B) illustrates views of the conventional photomask.
Figure 13B:
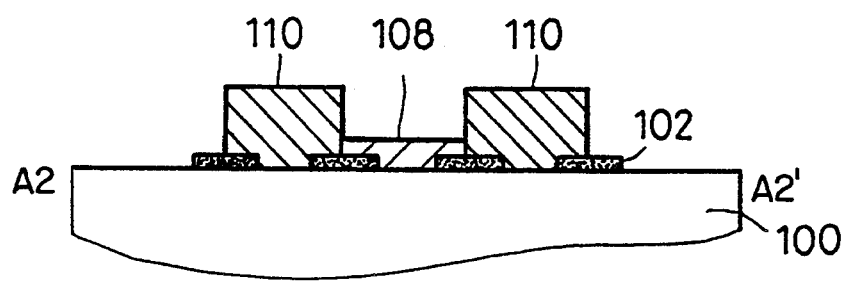

A minimum light intensity obtained when a focal point is shifted was calculated on the photomask according to this embodiment of FIGS. 1 and 2 (A-B), and the conventional photomask of FIG. 13 (A-B). In the photomasik according to this embodiment of FIGS. 1 and 2 (A-B), a light intensity is most lowered in the areas near the boundaries of the phase shifters 18. In the conventional photomask of FIG. 13 (A-B), a light intensity is most lowered in the areas, which are boundary parts of the phase shifters 108, 110.

Figure 3:
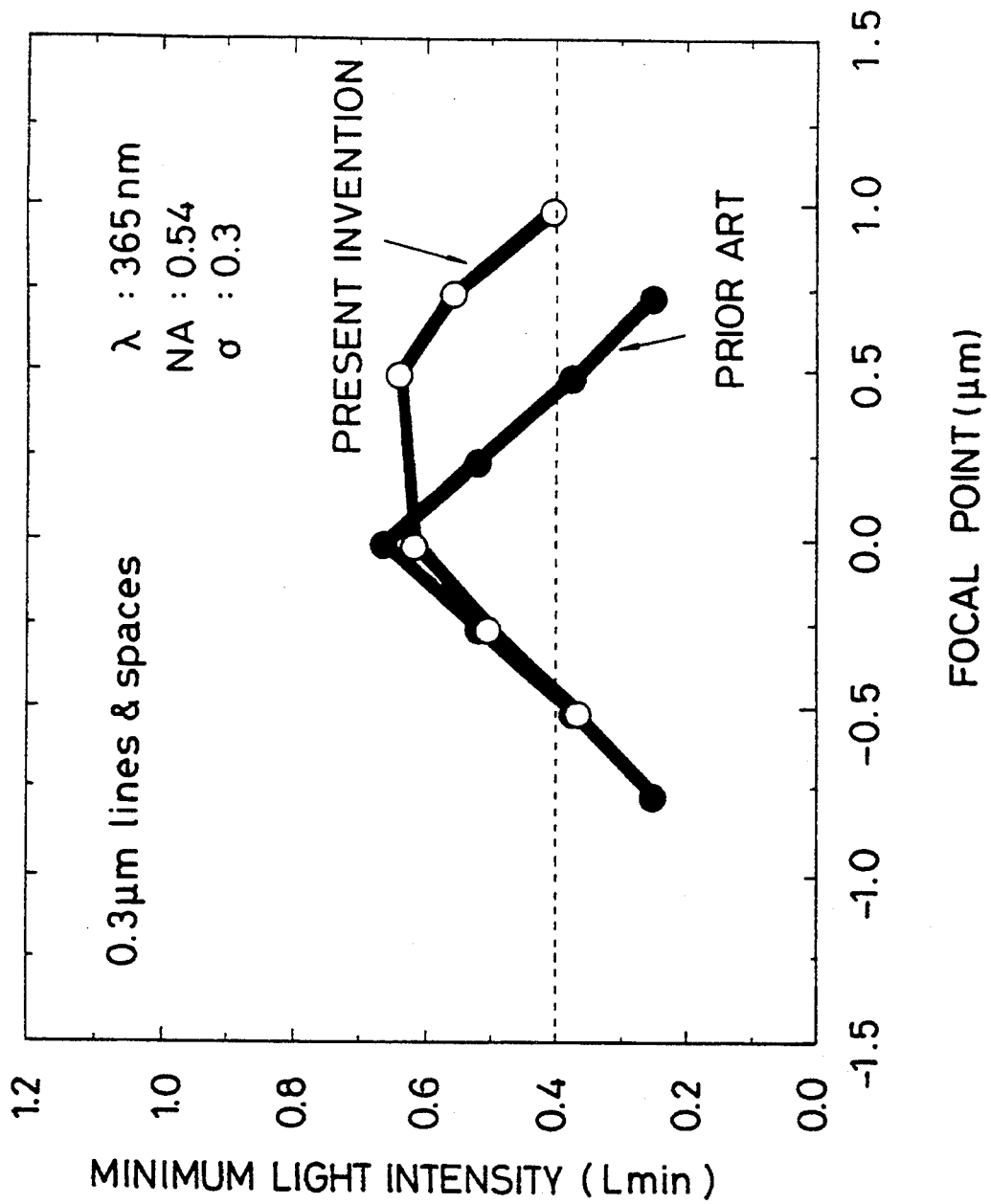
FIG. 3 is a graph showing a relationship between focal points and minimum light intensity of the photomasks in FIGS. 1 and 2, and FIG. 13.

The calculated results are shown in FIG. 3. Focal points are taken on the horizontal axis, and minimum light intensities obtained at the respective focal points are taken on the vertical axis. The lower limit of the practically allowable light intensities was set at 0.4. As shown in FIG. 1, in the conventional photomask, the minimum light intensity exceeds the limit value 0.4 between the focal points $-0.5$ $\mu$m and $+0.5$ $\mu$m. In the photomask according to this embodiment, the minimum light intensity exceeded the limit value 0.4 between the focal points $-0.5$ $\mu$m and $+1.0$ $\mu$m. The focal margin of the conventional photomask was 1.0 $\mu$m, and the photomask according to this embodiment was 1.5 $\mu$m, which is 1.5 times that of the conventional photomask.

Next, a first embodiment of the method of fabricating the photomask of the present invention will be explained with reference to FIGS. 4(A-C) and 5(A-C).

Figure 4A:
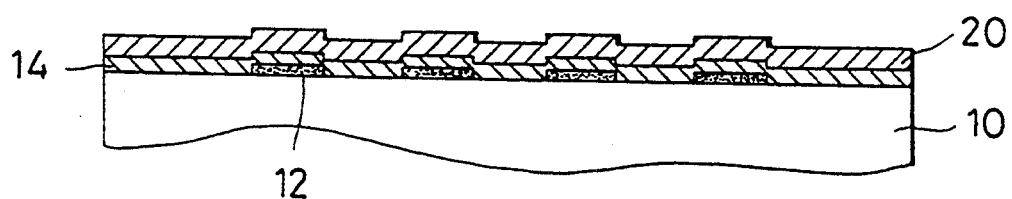
FIG. 4 (A-C) illustrates sectional views (1) illustrative of the steps of a first embodiment of the method of fabricating the photomask of the present invention.

First, a chrome layer 12 is evaporated on the entire surface of a mask substrate 10 of quartz and is patterned in lines. Subsequently on the entire surface an etching stopping layer 14 of $Al_2O_3$ is evaporated. Then an about 190 nm-thickness $SiO_2$ layer 20 is evaporated on the entire surface (FIG. 4A).

Figure 4B:
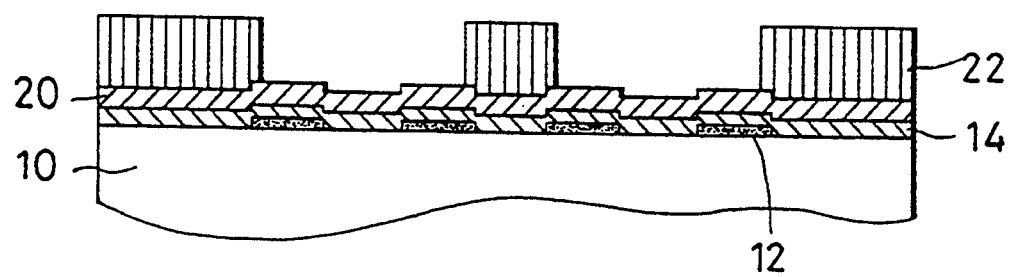

Next, a resist layer 22, which is so patterned that a region for the 90° phase shifter 16 to be formed thereon is masked, is formed (FIG. 4B).

Figure 4C:
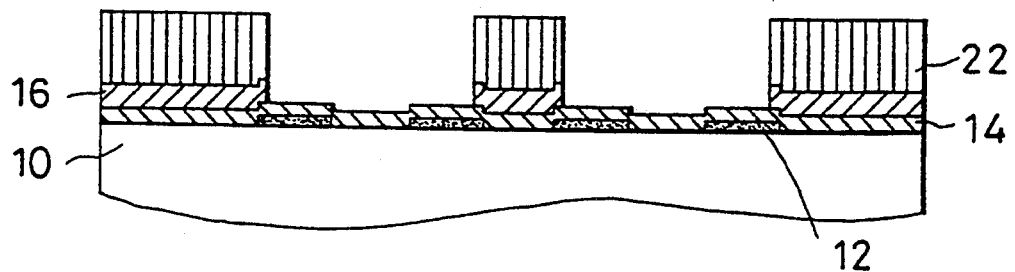

Then the $SiO_2$ layer 20 is etched by, e.g., RIE (Reactive Ion Etching) with the resist layer 22 as the mask, and the 90° phase shifter 16 is formed (FIG. 4C). This etching of the $SiO_2$ layer 20 is stopped at the etching stopping layer 14 and the surface of the mask substrate 10 is never etched.

Figure 5A:
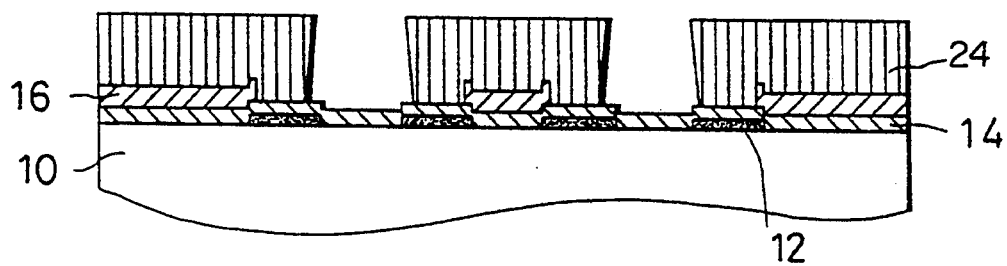
FIG. 5 (A-C) illustrates sectional views (2) illustrative of the steps of the first embodiment of the method of fabricating the photomask of the present invention.

Subsequently a resist layer 24 which is so patterned that a region for the 270° phase shifter 18 to be formed on is opened formed (FIG. 5A).

Figure 5B:
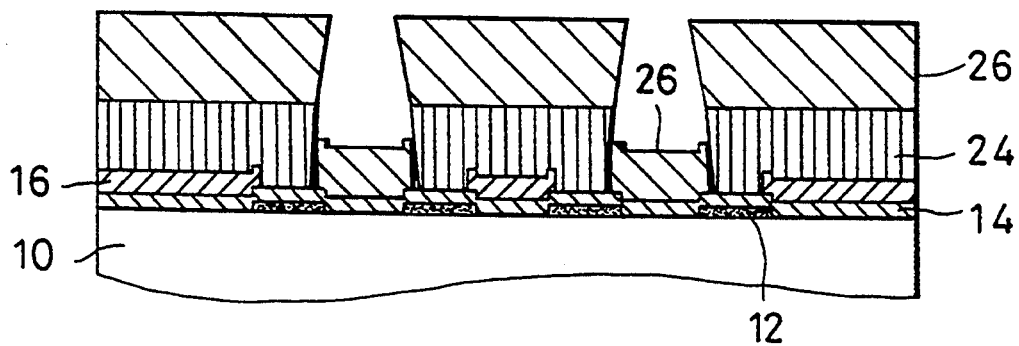

Then an about 570 nm-thickness $SiO_2$ layer 26 is evaporated on the entire surface (FIG. 5B). The $SiO_2$ layer 26 is formed both on the etching stopping layer 14 and on the resist layer 24.

Figure 5C:
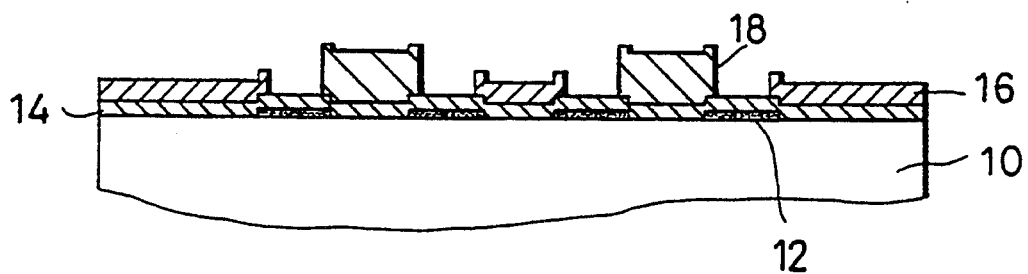

Next, the resist layer 24 is removed to lift off the resist layer 24 on the $SiO_2$ layer 26, and the 270° phase shifter 18 is formed (FIG. 5C).

In the method of fabricating the photomask illustrated in FIGS. 4 and 5, the 90° phase shifter 16 is formed by etching technique, and the 270° phase shifter 18 is formed by lift-off technique.

Next, a second embodiment of the method of fabricating the photomask according of the present invention will be explained below with reference to FIGS. 6(A-D) and 7(A-C).

Figure 6A:
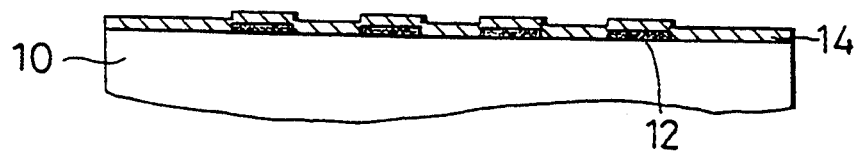
FIG. 6 (A-D) illustrates sectional views (1) illustrative of the steps of a second embodiment of the method of fabricating the photomask of the present invention.

First, a chrome layer 12 is evaporated on the entire surface of a mask substrate 10 of quartz, and is patterned in lines. Then an $Al_2O_3$ etching stopping layer 14 is evaporated on the entire surface (FIG. 6A).

Figure 6B:
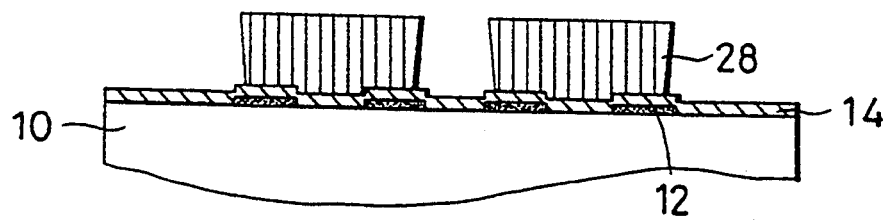

Then a resist layer 28, which is so patterned that a region for the 90° phase shifter 16 to be formed thereon is opened, is formed (FIG. 6B).

Figure 6C:
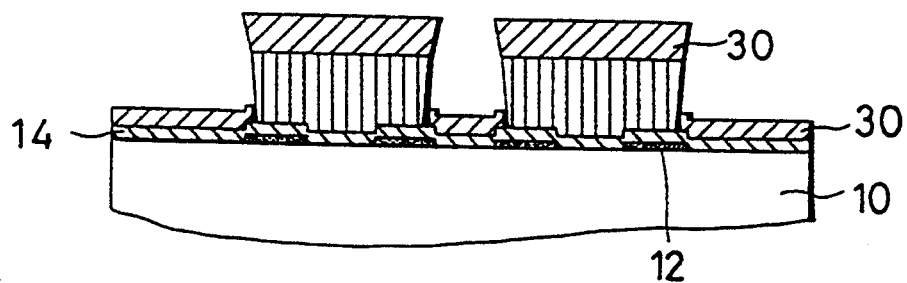

Next, an about 190 nm-thickness $SiO_2$ layer 30 is evaporated on the entire surface (FIG. 6C). The $SiO_2$ layer 30 is formed both on the etching stopping layer 14 and on the resist layer 28.

Figure 6D:
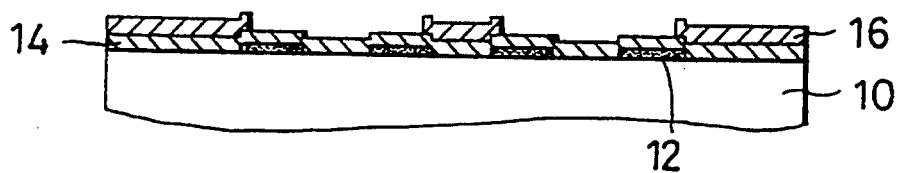

Subsequently the resist layer 28 is removed to lift off the $SiO_2$ layer 30 on the resist layer 28, and the 90° phase shifter 16 is formed (FIG. 6D).

Figure 7A:
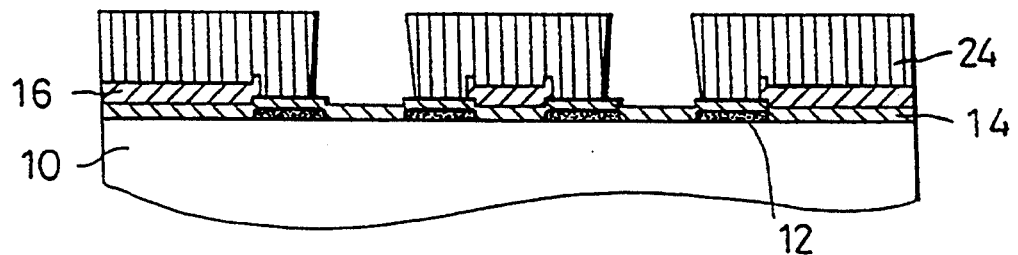
FIG. 7 (A-C) illustrates sectional views (2) illustrative of the steps of the second embodiment of the method of fabricating the photomask of the present invention.
Figure 7B:
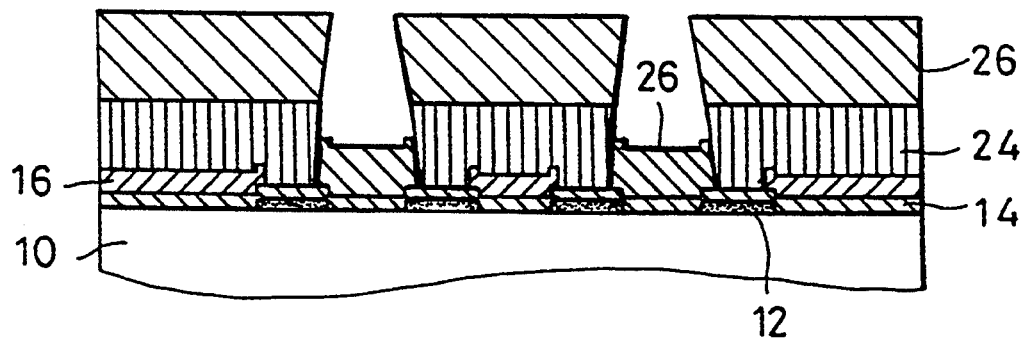
Figure 7C:
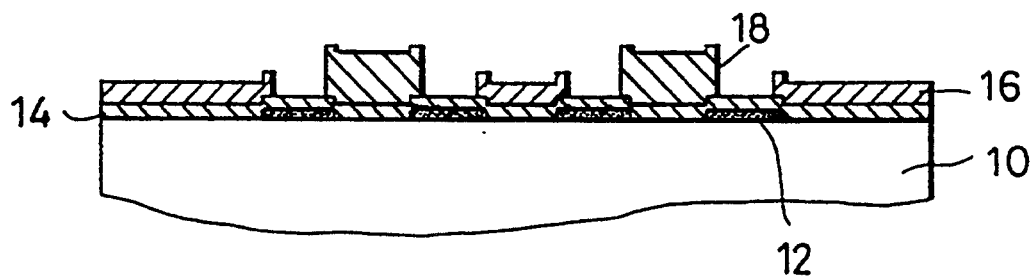

Then, similar to the first embodiment, a resist layer 24, which is so patterned that a region for the 270° phase shifter to be formed thereon is opened, is formed (FIG. 7A), and an about 570 nm-thickness $SiO_2$ layer 26 is evaporated on the entire surface (FIG. 7B). The $SiO_2$ layer 26 on the resist layer 24 is lifted off, and the 270° phase shifter 18 is formed (FIG. 7C).

In the method of fabricating the photomask illustrated in FIGS. 6(A-D) and 7(A-C), both the 90° phase shifter 16 and the 270° phase shifter 18 are formed by lift-off technique.

Methods of correcting the photomask according to the above-described embodiment will be explained below with reference to FIGS. 8(A-E), 9(A-D) and 10(A-E).

Figure 8A:
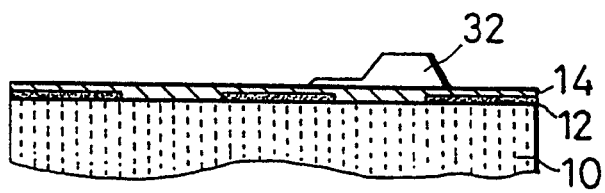
FIG. 8 (A-E) illustrates sectional views of the steps of a method of correcting the photomask according to the embodiment of the present invention.

With reference to FIG. 8(A-E) a method of correcting the photomask will be explained by means of a case that the 90° phase shifter 16 or the 270° phase shifter has a chipped pattern 32 (FIG. 8A).

Figure 8B:
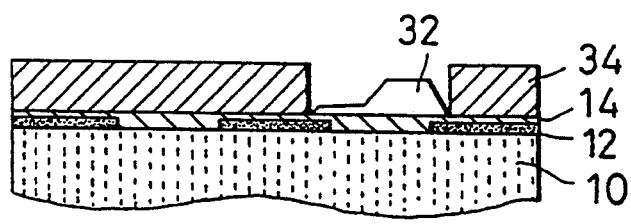

A resist layer 34, which is patterned so as to be opened at a part corresponding to the chipped pattern 32, is formed (FIG. 8B).

Figure 8C:
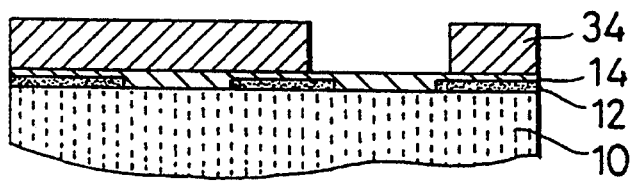

Then, the chipped pattern is etched off with the resist layer 34 as the mask (FIG. 8C).

Figure 8D:
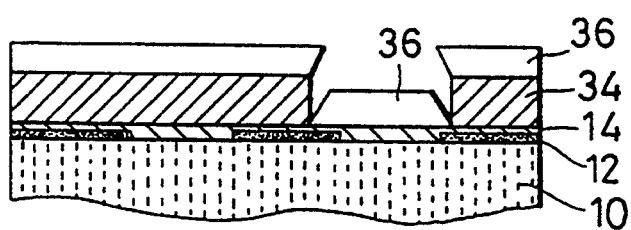

Subsequently a $SiO_2$ layer 36 of a required thickness which is to be the phase shifter is evaporated on the entire surface (FIG. 8D). The $SiO_2$ layer 36 is formed both on the etching stopping layer 14 and on the resist layer 34.

Figure 8E:
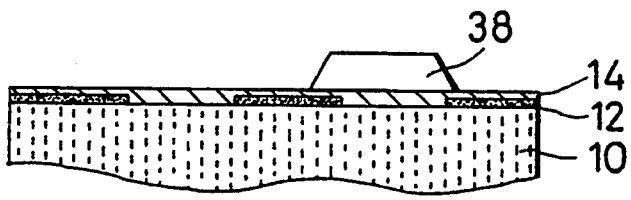

Then the resist layer 34 is removed to lift off the $SiO_2$ layer 36 on the resist layer 34, and a perfect phase shifter 38 without any defect is formed (FIG. 8E).

Figure 9A:
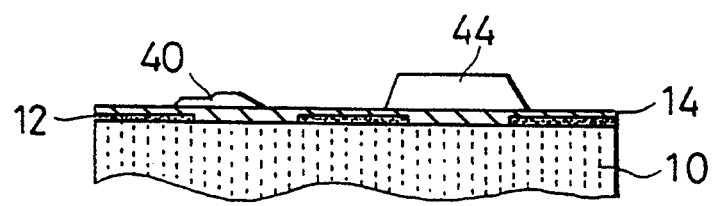
FIG. 9 (A-D) illustrates sectional views of the steps of a method of correcting the photomask according to the embodiment of the present invention.

With reference to FIG. 9(A-D) a method of correcting the photomask will be explained by means of a case that a residual pattern 40 is present at a part where neither a 90° phase shifter 16 nor the 270° phase shifter 18 should be formed (FIG. 9A).

Figure 9B:
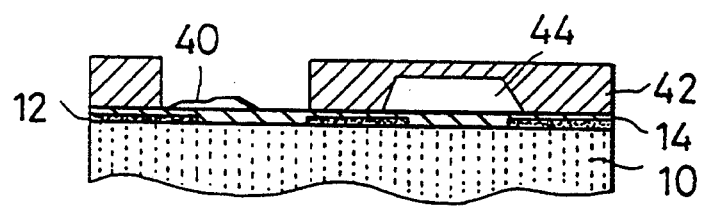

First a resist layer 42, which is patterned so as to be opened at a part corresponding to the residual pattern 40, is formed (FIG. 9B). A normal pattern 44 is covered protectively with the resist layer 42.

Figure 9C:
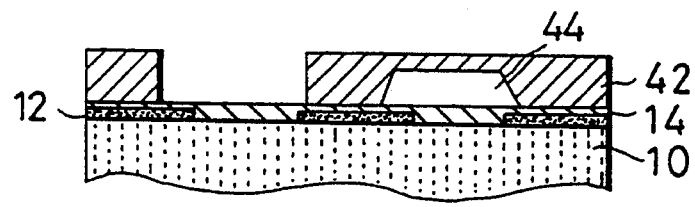

Then only the residual pattern 40 is etched off with the resist layer 44 as the mask (FIG. 9C).

Figure 9D:
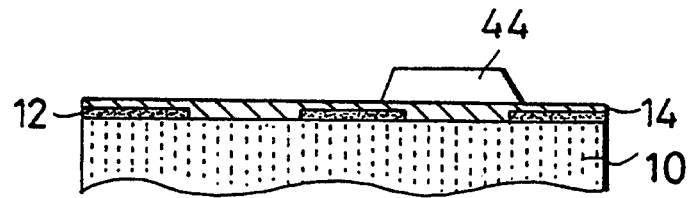

Subsequently the resist layer 44 is removed to leave only the normal pattern 44 (FIG. 9D).

In the photomask according to the embodiments of the present invention, the 90° phase shifter 16 and the 270° phase shifters 18 are not overlapped on each other. Consequently corrections of possible defects of the 90° phase shifter 16 and of the 270° phase shifter 18 can be made separately.

Figure 10A:
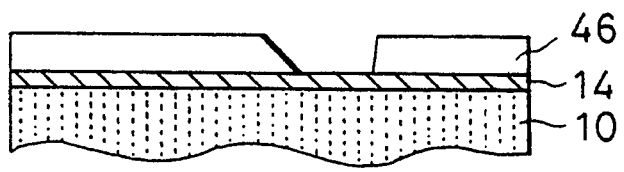
FIG. 10 (A-E) illustrates sectional views of the steps of a method of correcting the photomask according to the embodiment of the present invention.

With reference to FIG. 10(A-E), a method of correcting the photomask will be explained by means of a case that the 90° phase shifter 16 or the 270° phase shifter has a chipped part 46 (FIG. 10A).

Figure 10B:
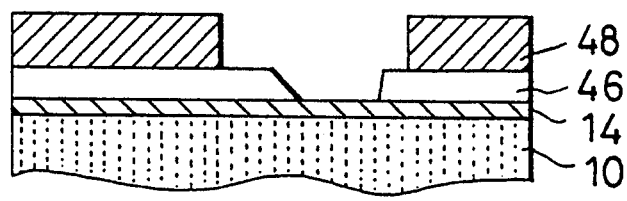

A resist layer 48, which is patterned so as to be opened at a part including the chipped part 46, is formed (FIG. 10B).

Figure 10C:
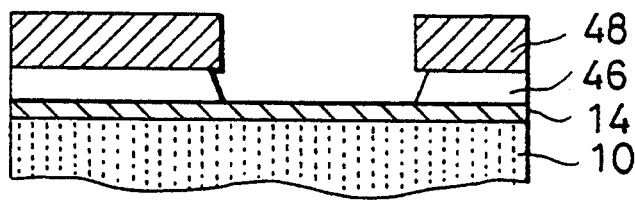

Then, the part including the chipped part 46 is etched off with the resist layer 48 as the mask (FIG. 10C).

Figure 10D:
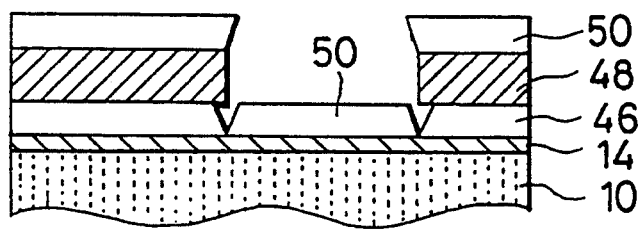

Subsequently, a $SiO_2$ layer 50 of a required thickness, which is to be the phase shifter, is evaporated on the entire surface (FIG. 10D). The $SiO_2$ layer 50 is formed both on the etching stopping layer 14 and on the resist layer 48.

Figure 10E:
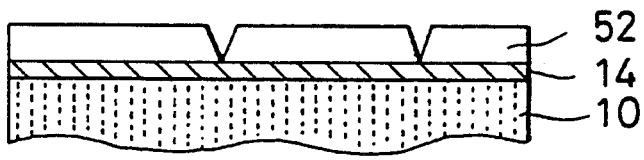

Then, the resist layer 48 is removed to lift off the $SiO_2$ layer 50 on the resist layer 48, and a perfect phase shifter 52 without any defect is formed (FIG. 10E).

Figure 11:
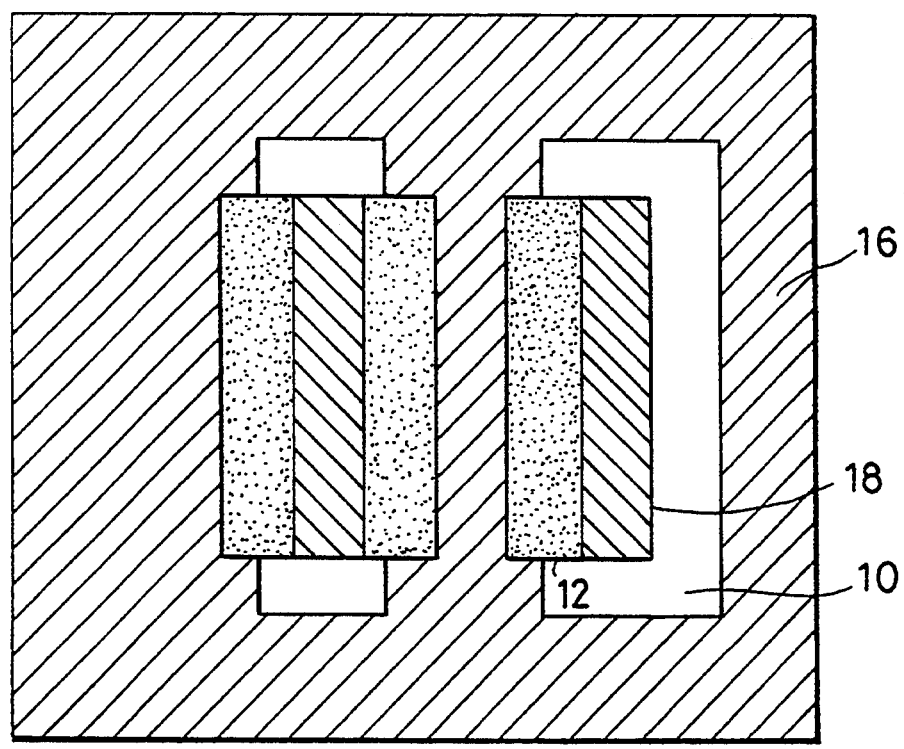
FIG. 11 is a view of the photomask according to another embodiment Of the present invention.
Figure 12A:
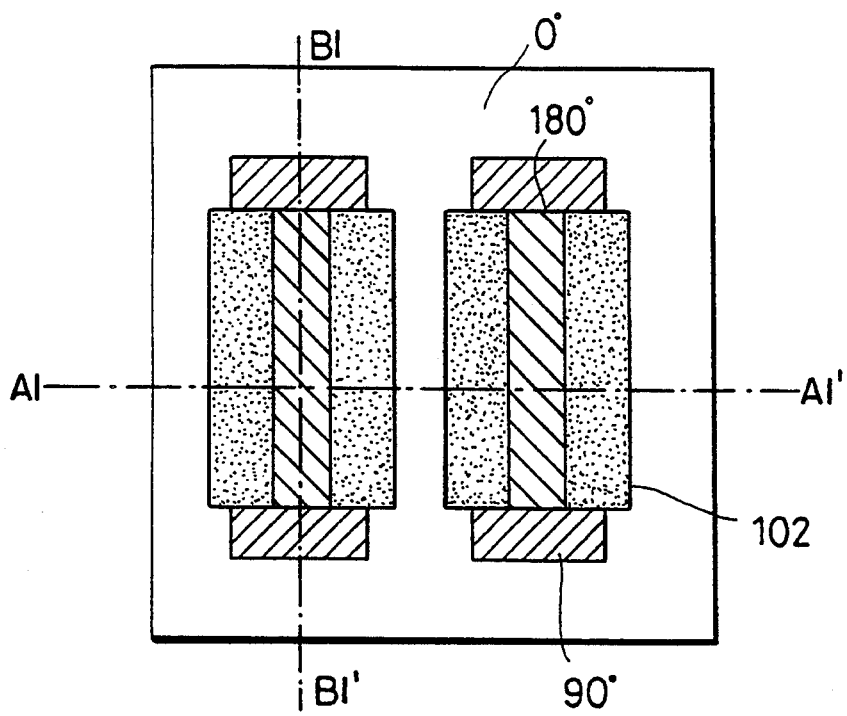
FIG. 12 (A-C) illustrates views of the conventional photomask.
Figure 12B:
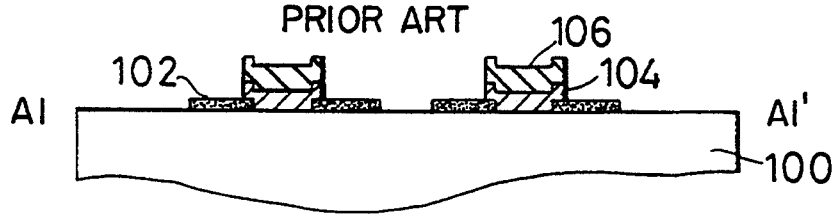
Figure 12C:
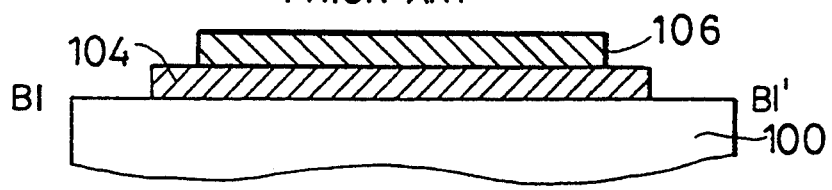

Next, the photomask according to another embodiment of the present invention will be explained below with reference to the plan view of FIG. 11.

Three chrome layers 12(A-C) are formed of a light shielding layer in lines on a mask substrate of quartz. An etching stopping layer (not shown) is formed on the entire surface of the mask substrate 10 including the chrome layers 12.

A 270° phase shifter 18 for shifting a phase by 270° is formed on the left one of two light transmitting areas between each of the chrome layers 12 and its adjacent one, and on a light transmitting area which is right of the right one of the two light transmitting areas between each of the chrome layers 12 and its adjacent one. The 270° phase shifters 18 are formed of, e.g., an about 570 nm-thickness $SiO_2$ layer.

A 90° phase shifter 16 for shifting a phase by 90° is formed on the right one of the two light transmitting areas sandwiched by each of the chrome layers 12 and its adjacent one. The 90° phase shifter is formed of, e.g,. an about 190 nm-thickness $SiO_2$ layer. The 90° phase shifter 16 is formed uninterrupted up to the peripheral areas of the chrome layers 12, but an allowance is provided for a light transmitting area on the right side of the right 270° phase shifter.

In the photomask according to this embodiment, the 90° phase shifter 16 and each 270° phase shifter 18 are adjacent to each other through a light transmitting area without any phase shifter formed thereon or the light shielding areas of the chrome layers 12 formed thereon. Accordingly, there is no part where a phase sharply shifts by an angle larger than 90°. The 90° phase shifter 16 and the 270° phase shifters 18 are not overlapped on each other. Accordingly, as described above, corrections of possible defects of the 90° phase shifter 16 and the 270° phase shifters can be separately made.

The present invention is not limited to the above-described embodiments and can cover other different variations and modifications.

In the above-described embodiments, for example, the etching stopping layer is formed on the mask substrate and the chrome layers, but the etching stopping layer instead may be formed on the mask substrate and below the chrome layers.

In the above-described embodiments, the formation of the 90° phase shifters are followed by the formation of the 270° phase shifters, but reversely, the formation of the 270° phase shifters can followed by the formation of the 90° phase shifters.

In the above-described embodiments, the phase shifters are formed of $SiO_2$, but may be formed of other materials. Especially in a case that there is the selectivity of an etching process between a material of the phase shifters and a material of the mask substrate, the phase shifter may be formed only by lift-off technique.

In a case that defect corrections of a phase shifter pattern are not necessary, the etching stopping layer may not be formed.

As described above, according to the present invention, the first area with the 90° phase shifter is formed, and the second area where the 270° phase shifters are formed sandwich the third area therebetween where no light shielding area or no phase shifter is formed. Accordingly there is no part where an intensity is lowered even when a phase sharply shifts even by 180° in the light transmitting area. Furthermore, the 90° shifter and the 270° phase shifters are not overlapped. Accordingly if the 90° shifters and the 270° phase shifters should have defects, the defects could be separately corrected with ease. Thus, the present invention much contributes to optical lithography for ultra-micronized patterns of semiconductor integrated circuits and so on.

What is claimed is:

1. A photomask comprising light shielding areas with a light shielding layer formed on a mask substrate, and a light transmitting area defined on the mask substrate by the light shielding areas, the light transmitting area being divided in a first area with a 90° phase shifter formed thereon for shifting phase of transmitted light by $90°+m\times360°$ (m=0,1,2, . . .) a second area with a 270° phase shifter formed thereon for shifting phase of transmitted light by $270°+n\times360°$ (n=0,1,2,...), and a third area for shifting phase of transmitted light by 0°, the first and the second areas being arranged without being overlapped on each other and with the light shielding areas or the third area located therebetween.

2. A photomask according to claim 1, wherein an etching stopping layer for blocking etching of the mask substrate is formed on the mask substrate.

3. A photomask according to claim 1, wherein the etching stopping layer for blocking etching of the mask substrate is formed on the mask substrate in the light transmitting area, and on the light shielding layer in the light shielding areas.

4. A photomask comprising light shielding areas with a light shielding layer formed on a mask substrate, and a light transmitting area defined on the mask substrate by the light shielding areas, the light transmitting area being divided in a first area with a 90° phase shifter formed thereon for shifting phase of transmitted light by $90°+m\times360°$ (m=0,1,2, . . .), a second area with a 270° phase shifter formed thereon for shifting phase of transmitted light by $270°+n\times360°$ (n=0,1,2,...), and a third area for shifting phase of transmitted light by 0°, the first and the second areas being arranged without being overlapped on each other and with the light shielding areas or the third area located therebetween, the light shielding layer having a plurality of light shielding lines, which define a plurality of light transmitting spaces;

the 90° phase shifter being formed on a peripheral area of the light shielding lines and the light transmitting spaces;

the 90° phase shifter and the 270° phase shifter being alternately formed on each of the light transmitting spaces;

the 90° phase shifters on the light transmitting spaces being formed uninterruptedly up to the 90° phase shifter on the peripheral area; and light transmitting areas with neither the 90° phase shifter nor the 270° phase shifter being located between the 270° phase shifters on the light transmitting spaces and the 90° phase shifter on the peripheral area.

5. A photomask according to claim 4, wherein the 90° phase shifter is formed on the light transmitting space adjacent to the light shielding line at the most outer side of the light shielding lines;

the 270° phase shifter is formed on an area adjacent to the light shielding line at the most outer side of the light shielding lines; and light transmitting areas with neither the 90° phase shifter nor the 270° phase shifter are located between the 270° phase shifter on the area and the 90° phase shifter on the peripheral area.

6. A photomask according to claim 5, wherein an etching stopping layer for blocking etching of the mask substrate is formed on the mask substrate.

7. A photomask according to claim 5, wherein the etching stopping layer for blocking etching of the mask substrate is formed on the mask substrate in the light transmitting area, and on the light shielding layer in the light shielding areas.

8. A photomask according to claim 4, wherein an etching stopping layer for blocking etching of the mask substrate is formed on the mask substrate.

9. A photomask according to claim 4, wherein the etching stopping layer for blocking etching of the mask substrate is formed on the mask substrate in the light transmitting area, and on the light shielding layer in the light shielding areas.

10. A method of fabricating a photomask comprising the steps of:

forming an etching stopping layer on an entire area of a mask substrate, and forming a light shielding layer on parts of a surface to be light shielding areas;

forming a first phase shifter on the entire surface for shifting phase of transmitted light by a first angle;

forming a first resist layer on a first area of a light transmitting area without the light shielding layer formed thereon;

etching off a part of the first phase shifter with the first resist layer as a mask to leave the first phase shifter on the first area;

forming a second resist layer with an opening corresponding to a second area of the light transmitting area;

forming a second phase shifter on the entire surface for shifting phase of the transmitted light by a second angle; and removing the second resist layer to lift off the second phase shifter to leave the second phase shifter in the second area, wherein the first phrase shifter is a 90° phase shifter for shifting phase of transmitted light by $90° + m \times 360°$ (m=0,1,2, . . .), and the second phase shifter is a 270° phase shifter for shifting phase of transmitted light by $270° + n \times 360°$ (n=0,1,2, . . .).

11. A method of fabricating a photomask, comprising the steps of:

forming an etching stopping layer on an entire surface of a mask substrate, and forming a light shielding layer on light shielding areas;

forming a first resist layer with an opening corresponding to a first area of a light transmitting area;

forming on the entire surface a first phase shifter for shifting phase of transmitted light by a first angle;

removing the first resist layer to lift off the first phase shifter and leaving the first phase shifter in the first area;

forming a second resist layer with an opening corresponding to a second area of the light transmitting area;

forming on the entire surface a second phase shifter for shifting phase of the transmitted light by a second angle; and removing the second resist layer to lift off the second phase shifter and leaving the second phase shifter in the second area, wherein the first phase shifter is a 90° phase shifter for shifting phase of transmitted light by $90° + m \times 360°$ (m=0,1,2, . . .), and the second phase shifter is a 270° phase shifter for shifting phase of transmitted light by $270° + n \times 360°$ (n=0,1,2, . . .).

* * * * *